(12) United States Patent
Shiye

(10) Patent No.: US 11,655,790 B2
(45) Date of Patent: May 23, 2023

(54) IGNITION DRIVE MODULE

(71) Applicant: KUNSHAN CADIC AUTO ELECTRIC CO., LTD, Jiangsu (CN)

(72) Inventor: Shen Shiye, Jiangsu (CN)

(73) Assignee: Kunshan Cadic Auto Electric Co. Ltd, Suzhou (CN)

(*) Notice: Subject to any disclaimer, the term of this patent is extended or adjusted under 35 U.S.C. 154(b) by 0 days.

(21) Appl. No.: 17/616,173

(22) PCT Filed: Jun. 24, 2019

(86) PCT No.: PCT/CN2019/092613
§ 371 (c)(1),
(2) Date: Dec. 2, 2021

(87) PCT Pub. No.: WO2020/244002
PCT Pub. Date: Dec. 10, 2020

(65) Prior Publication Data
US 2022/0243694 A1    Aug. 4, 2022

(30) Foreign Application Priority Data

Jun. 3, 2019 (CN) .......................... 201910475100.2

(51) Int. Cl.
*F02P 3/08* (2006.01)
*F02P 17/12* (2006.01)
(Continued)

(52) U.S. Cl.
CPC .............. *F02P 3/045* (2013.01); *F02P 3/0861* (2013.01); *F02P 3/0869* (2013.01); *H03K 5/22* (2013.01); *H03K 17/567* (2013.01); *H01F 38/12* (2013.01)

(58) Field of Classification Search
CPC ......... F02P 3/0861; F02P 3/0869; F02P 17/12
(Continued)

(56) References Cited

U.S. PATENT DOCUMENTS 3,989,024 A * 11/1976 Lai .................... F02P 3/0456
701/101
4,300,518 A * 11/1981 Petrie .................. F02P 3/0456
123/609

(Continued)

FOREIGN PATENT DOCUMENTS

CN        206256989 U    6/2017
CN        107923360 A    4/2018
(Continued)

*Primary Examiner* — Erick R Solis
(74) *Attorney, Agent, or Firm* — Laabs Intellectual Property

(57) ABSTRACT

Disclosed is an ignition drive module with stable performance and reliable function, which comprises a module signal input end, a voltage input end, a module signal output end, a comparator connected to the module signal input end a maximum dwell timer module connected to the comparator, a logical judgment module connected to the comparator, and an insulated gate bipolar transistor connected to the logical judgment module. The logical judgment module receives signals from the maximum dwell timer module and the comparator to determine whether to activate the insulated gate bipolar transistor. The output end of the insulated gate bipolar transistor is connected to the module signal output end.

10 Claims, 3 Drawing Sheets

(51) Int. Cl.
*F02P 3/045* (2006.01)
*H03K 5/22* (2006.01)
*H03K 17/567* (2006.01)
*H01F 38/12* (2006.01)

(58) Field of Classification Search
USPC ........................................................ 123/609
See application file for complete search history.

(56) References Cited

U.S. PATENT DOCUMENTS

| | | | | |
|---|---|---|---|---|
| 4,329,959 | A * | 5/1982 | Javeri | F02P 3/0456 377/2 |
| 4,362,144 | A * | 12/1982 | Yamaguchi | F02P 3/0453 123/644 |
| 4,367,722 | A * | 1/1983 | Mizuno | F02P 3/0453 123/644 |
| 6,050,242 | A * | 4/2000 | Wilkinson | F02P 7/077 324/207.2 |
| 7,055,372 | B2 * | 6/2006 | Daniels | F02M 26/01 73/35.08 |
| 9,525,273 | B1 | 12/2016 | Yamamoto et al. | |
| 9,784,230 | B2 * | 10/2017 | Pawlak | F02P 9/002 |
| 10,330,071 | B2 | 6/2019 | Silva et al. | |
| 10,641,232 | B2 * | 5/2020 | Morrow, Jr. | F02P 3/0456 |
| 2006/0000460 | A1 * | 1/2006 | Masters | F02P 5/1502 123/406.59 |

FOREIGN PATENT DOCUMENTS

| | | |
|---|---|---|
| CN | 110230565 A | 9/2019 |
| CN | 110259619 A | 9/2019 |
| EP | 0447975 A1 | 9/1991 |
| JP | S58174156 A | 10/1983 |

* cited by examiner

IGNITION DRIVE MODULE

FIELD OF THE INVENTION

The present invention relates to an ignition drive module.

Background of the Invention

In the automobile engine ignition system, the ignition coil is an executive component that provides ignition energy for igniting the air and fuel mixture in the engine cylinder. It is a special pulse booster based on the principle of electromagnetic induction. The low voltage is turned on and off according to the set frequency to make the secondary produce a voltage of 20-40 KV through the spark plug to produce an electric spark. Due to the precise nature of ignition coils, ignition coils with different performances need to be matched with dedicated drive circuits to meet functional requirements.

SUMMARY OF THE INVENTION

The object of the invention is to provide an ignition drive module with stable performance and reliable function.

To obtain one or more of these objects, the present invention provides an ignition drive module, comprising a module signal input end, a voltage input end and a module signal output end, characterized in that it comprises a comparator connected to the module signal input end, a maximum dwell timer module connected to the comparator, a logical judgment module connected to the comparator, and an insulated gate bipolar transistor connected to the logical judgment module which receives the signals from the maximum dwell timer module and the comparator to determine whether to activate the insulated gate bipolar transistor whose output end is connected to the module signal output end.

Preferably, it comprises a pull-down current input end which is respectively connected to the input ends of the comparator along with the module signal input end.

Preferably, a current buffer is provided between the comparator and the pull-down current input end.

Preferably, it comprises a peak filter connected to the output end of the comparator so as to filter the input positive or negative peak value less than preset time Ts.

Preferably, it comprises a dwell time input end connected to the maximum dwell timer module, the maximum dwell time of which can be modified by setting the dwell time capacitor.

Preferably, the dwell time input end is provided with a dwell time capacitor.

Preferably, a soft-off switch is arranged between the maximum dwell timer module and the dwell time input end, one end of which is connected to the insulated gate bipolar transistor so that the soft-off switch is turned on to turn off the insulated gate bipolar transistor.

According to another aspect, the present invention provides an ignition drive circuit comprising the ignition drive module, and a triode connected to the module signal output end, wherein the base of the triode is connected to the module signal output end and the collector of the triode is connected to an ignition coil.

Preferably, the emitter of the triode is grounded through a sensing resistor and the ignition drive module is provided with a sensing voltage input end which is connected to the emitter of the triode.

Preferably, the ignition coil comprises a primary coil and a secondary coil, and one end of the primary coil is connected to the base of the triode, and the other end is connected to the voltage input ends.

By adopting the technical scheme, the present invention is an ignition drive module with stable performance and reliable function.

BRIEF DESCRIPTION OF THE DRAWING

Other aspects and advantages of the present invention will become clear from the following detailed description taken in conjunction with the accompanying drawings, which illustrate, by way of example, the principles of the invention.

DETAILED DESCRIPTION OF THE PREFERRED EMBODIMENTS

The detailed description of the preferred embodiment according to the invention is given below with the accompanying drawings so that the benefits and features of the present invention are understood for those skilled in the art.

Figure 1:
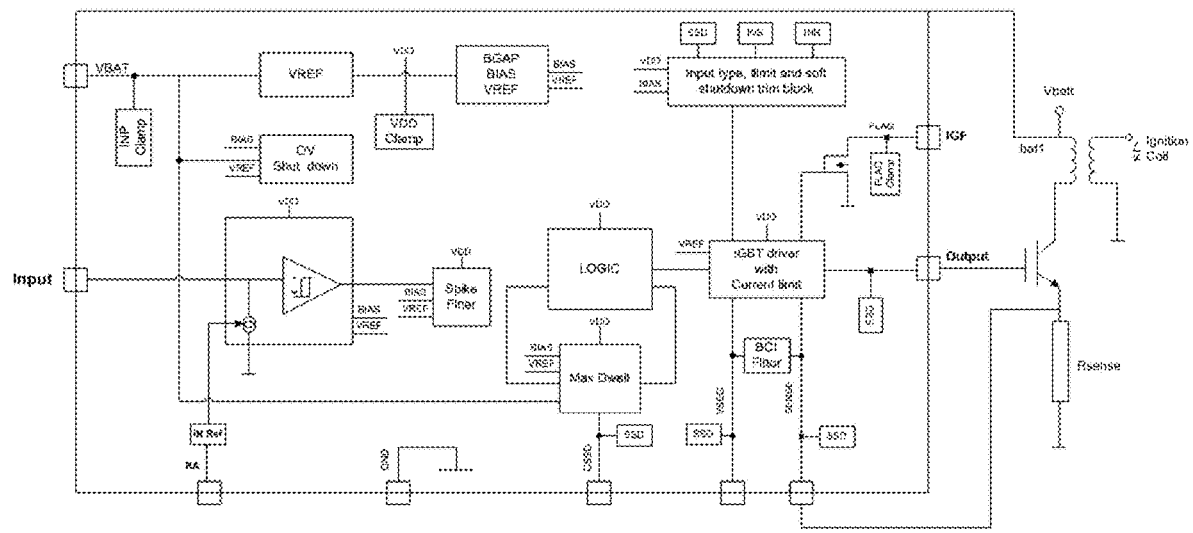
FIG. 1 is a block diagram of the preferred embodiment of the circuit structure of the ignition drive module according to the invention.
Figure 2:
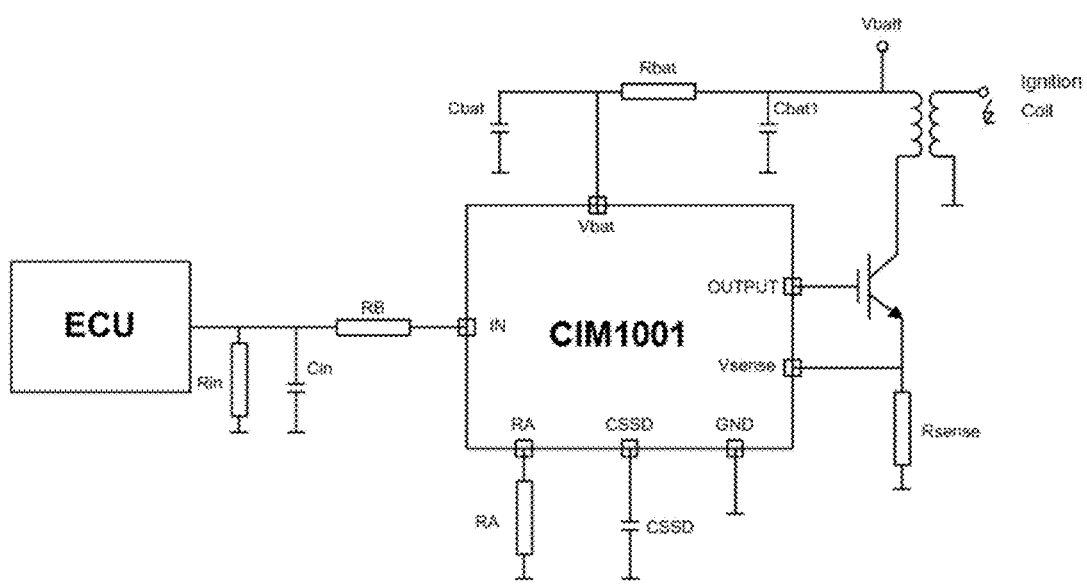
FIG. 2 is a schematic diagram of a typical application of an ignition drive circuit.

Referring to FIG. 1 and FIG. 2, FIG. 1 is a block diagram of the preferred embodiment of the circuit structure of the ignition drive module according to the invention, and FIG. 2 is a schematic diagram of a typical application of an ignition drive circuit. An ignition drive circuit with stable performance and reliable function comprises an ignition drive module and a triode connected to the module signal output end. The base of the triode is connected to the module signal output end and the collector of the triode is connected to an ignition coil. The emitter of the triode is grounded through a sensing resistor and the ignition drive module is provided with a sensing voltage input end which is connected to the emitter of the triode. The ignition coil comprises a primary coil and a secondary coil. One end of the primary coil is connected to the base of the triode and the other end is connected to the voltage input ends.

The ignition drive module (CIM1001) comprises a module signal input end, a voltage input end, a module signal output end, a comparator connected to the module signal input end, a maximum dwell timer module connected to the comparator, a logical judgment module connected to the comparator, and an insulated gate bipolar transistor connected to the logical judgment module. The logical judgment module receives signals from the maximum dwell timer module and the comparator to determine whether to activate the insulated gate bipolar transistor. The output end of the insulated gate bipolar transistor is connected to the module signal output end.

The ignition drive module comprises a pull-down current input end which is respectively connected to the input ends of the comparator along with the module signal input end. A current buffer is provided between the comparator and the pull-down current input end.

The ignition drive module comprises a peak filter connected to the output end of the comparator so as to filter the input positive or negative peak value less than preset time Ts.

The ignition drive module comprises a dwell time input end connected to the maximum dwell timer module, the maximum dwell time of which can be modified by setting the dwell time capacitor. Preferably, the dwell time input end is provided with a dwell time capacitor. A soft-off switch is arranged between the maximum dwell timer module and the dwell time input end, one end of which is connected to the insulated gate bipolar transistor so that the soft-off switch is turned on to turn off the insulated gate bipolar transistor.

The ignition drive module (CIM1001) is designed to directly drive an ignition IGBT and control the current and spark event of the coil. The coil current is controlled via the input pin. When the single-end input is driven high, the output of the CIM1001 is enabled to turn on the IGBT and start charging the coil. The CIM1001 will sink a current (IIN) into the input pin based on the programmed current on the RA line. The advantages of the ignition drive module include supporting single-end input for ground shift disturbances suppression, signal line input buffer, input spike filter, operation from the ignition or battery line, ground shift tolerance: −1.5V to 16V, programmable maximum dwell time, programmable input pull-down current, IGBT current limiting through Vsense pin, soft shutdown the following maximum dwell time out, SOP-8 packages and RoHS compliant.

A maximum dwell timer is included in the CIM1001 which will turn off the IGBT if the input remains active longer than the programmed time. The input spike filter will suppress single-end input signal(s) of less than 7μ sec in duration. The time interval can be modified through an external capacitor. When exceeding the maximum dwell time, the CIM1001 will enter a Soft-Shut-Down (SSD) mode of slowly dropping the collector current of the triode by lowering the gate voltage of the IGBT thereby discharging the coil such as to inhibit suppress a spark event. The CIM1001 will also limit the collector current of the IGBT to Ic (lim) during charging. This is also achieved by the sense resistor in the emitter lead of the Ignition IGBT by developing an input signal to the Vsense pin of CIM1001.

Figure 3:
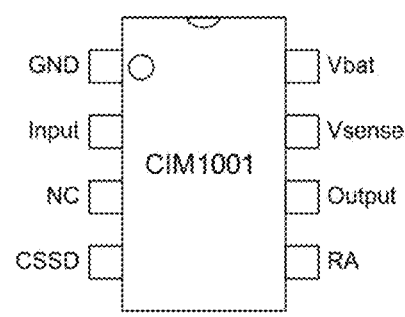
FIG. 3 is a schematic diagram of the ignition drive module of PIN connection.

Refer to FIG. 3, which is a schematic diagram of the ignition drive module of PIN connection. The CIM1001 is an advanced Ignition IGBT controlled IC which is available in a SOP8 package or die sales. This full-featured smart ignition IGBT driver is particularly advantageous in "switch on coil" applications where the size and system performance of the ignition driver are important.

TABLE 1

| PIN NAME | PIN TYPE | CIM1001 PIN # | PIN FUNCTION DESCRIPTION |
| --- | --- | --- | --- |
| GND | P | 1 | Ground reference |
| Input | I, A | 2 | Signal-end input signal |
| NC | — | 3 | Connect to GND or floating |

TABLE 1-continued

| PIN NAME | PIN TYPE | CIM1001 PIN # | PIN FUNCTION DESCRIPTION |
| --- | --- | --- | --- |
| CSSD | I/O, A | 4 | Adjust maximum dwell time and soft-shutdown current output (to external capacitor) |
| RA | O, A | 5 | Input reference current output (to the external resistor) |
| Output | O, A | 6 | Gate drive to the IGBT |
| Vsense | I, A | 7 | Sense input used for Ilim function |
| Vbat | P | 8 | Supply voltage |

"P" denotes power supply pin.

"G" denotes ground pins. All VSS pins are internally shorted resistively.

"O", "VO", "A" denotes output only, input/output, and analog types.

"PU" or "PD" denotes pins with internal pull-up or pull-down.

Functional Description

1. Input and Spike Filter for Single-End Input Signal

When the input signal voltage reaches $V_{INH}$, the IGBT will be turned on to charge the coil. When the input voltage is lower than $V_{INL}$, the coil current through the IGBT will be turned off. If the CIM1001 is running in SSD mode, the input signal control is disabled. After the SSD sequence, the input control will be re-enabled after the input reaches a valid low value. Positive and negative peak values less than the duration of tspike at the input line will be filtered out and the IGBT will not be turned on/off.

2. Maximum Dwell Time and Soft-Shutdown (SSD)

Figure 4:
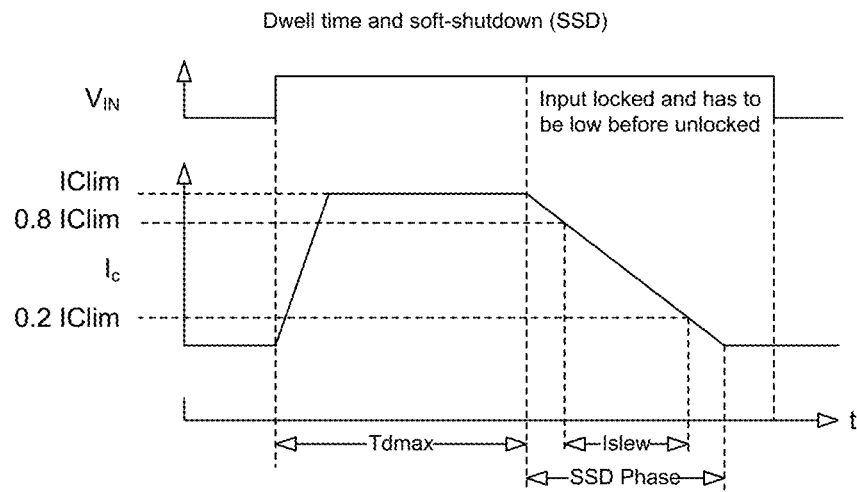
FIG. 4 is a schematic diagram of the relationship between the dwell time and the soft shutdown (SSD) of the ignition drive circuit.
Figure 5:
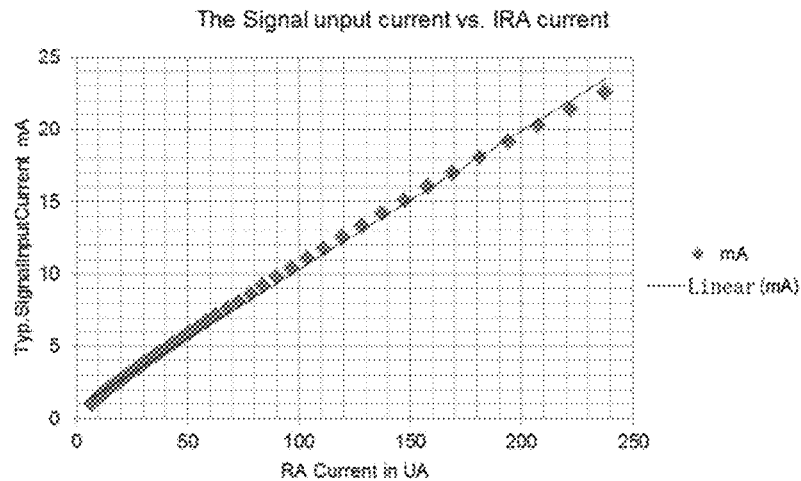
FIG. 5 is a schematic diagram of the relationship between the signal input current and the IRA current of the ignition drive circuit.
Figure 6:
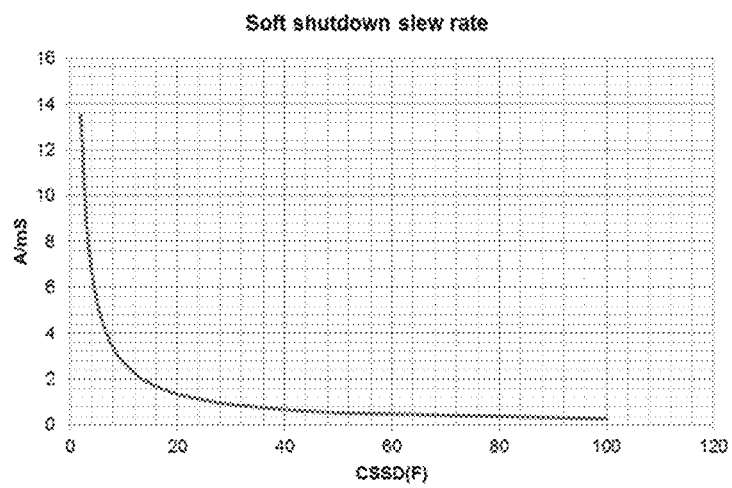
FIG. 6 is a schematic diagram of the soft shutdown conversion rate of the ignition drive circuit.
Figure 7:
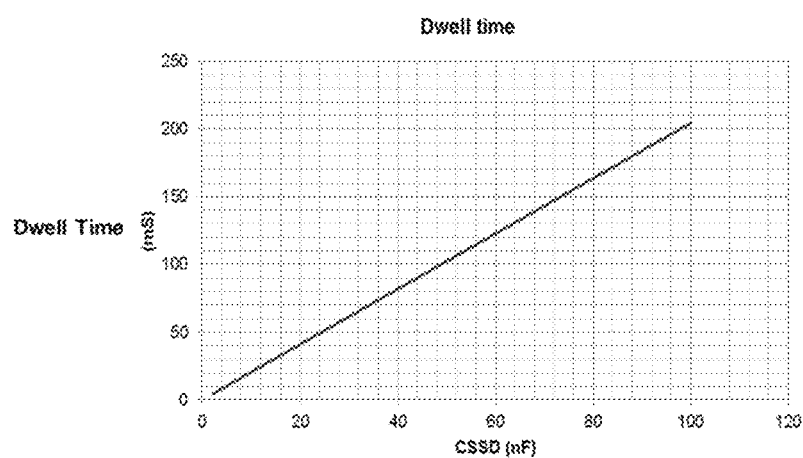
FIG. 7 is a schematic diagram of the relationship between the CSSD capacitor and the maximum dwell time of the ignition driving circuit.

FIG. 4 is a schematic diagram of the relationship between the dwell time of the ignition drive circuit and soft shutdown (SSD). FIG. 5 is a schematic diagram of the relationship between the signal input current of the ignition drive circuit and the IRA current. FIG. 6 is The schematic diagram of the soft shutdown conversion rate of the ignition drive circuit. FIG. 7 is a schematic diagram of the relationship between the CSSD capacitor of the ignition drive circuit and the maximum dwell time. When the IGBT is turned on, a delay timer is started depending on the value of the external CSSD capacitor. If a valid falling edge is not received after the time $T_{dmax}$, the IGBT will be turned off slowly. The coil current will not exceed the typical conversion rate of typical 1.2 A/ms. If a valid falling edge is received after the time $T_{dmax}$, the edge will be ignored and the soft shutdown will be completed. The IGBT cannot be subsequently turned on until a valid rising edge is detected. If the value of the CSSD capacitor is less than 2.2 nF or the CSSD pin is short-circuited to ground, the maximum dwell time and SSD functions will be disabled (i.e., directly enter the hard shutdown (HSD) mode). Only CIM1001 provides SSD function.

Electrical Characteristics

1. Absolute Maximum Ratings

Stresses exceeding the absolute maximum ratings may damage the device. It is not recommended to apply such level stress to the parts, or the device may not work or operate under the operating conditions. In addition, long-term exposure to stress higher than recommended operating conditions may affect the reliability of the equipment. The absolute maximum ratings are stress ratings only.

TABLE 2

| Symbol | Parameter | Min. | Max. | Unit |
|---|---|---|---|---|
| $V_{bat}$ | Voltage at $V_{bat}$ pin (excl. EMC transients) | −0.3 | 28 | V |
| $V_{IN}$ | Voltage at single-end Input pin with external Rin | −2 | 16 | V |
| $V_{RA}$, $V_{CSSD}$ | Voltage at RA and CSSD | −0.3 | 5 | V |
| $V_{OUTPUT}$ | Voltage at Gate Output | −0.3 | 6.5 | V |
| Vsense | Voltage on Vsense pin | 0 | 400 | mV |
| $T_J$, $T_{STG}$ | Operating and Storage Temperature Range | −40 | 150 | °C. |
| $P_{max}$ | Maximum power dissipation (continuous) at TC = 25° C. | | 0.625 | W |
| $R_{\Theta JA}$ | Thermal Resistance junction-case (typical)_ | | 200 | °C./W |
| $V_{ESD1}$(pin to pin) | Electrostatic Discharge Voltage (Human Body Model) according to MIL STD 883D, method 3015.7 and EOS/ESD Assn. standard S5.1-1993 | | 2 | kV |

2. Electrical Characteristics

TABLE 3

| Symbol | Parameter | Conditions | Min. | Typ. | Max. | Unit |
|---|---|---|---|---|---|---|
| Power Supply Conditions Vbat = 6 to 28 V; $T_J$ = −40° C. to 150° C. (unless otherwise specified) | | | | | | |
| $V_{bat1}$ | Operating voltage | Coil switching function | 4 | | 28 | V |
| $V_{bat2}$ | Operating voltage | All functions | 6 | | 28 | V |
| $I_{bat}$ | Supply current | TJ = 150° C., Vbat = 28 V, Input = 5 V | | | 5 | mA |
| $V_{clamp}$ | Vbattery clamp | Ibatt = 10 mA | 35 | 40 | 50 | V |
| Sense Pin Conditions Vbat = 6 to 28 V; $T_J$ = −40° C. to 150° C. (unless otherwise specified) | | | | | | |
| $V_{limit}$ | Sense Voltage at current limit | TJ = −40° C. to 150° C. (6 v < Vbat < 28 v) | 185 | 200 | 215 | mV |
| $T_{D1}$ | Turn on delay time | (Time from Input = 4.0 V to Vout = 4.0 V) | | 7 | | us |
| $T_{D2}$ | Turn off delay time | (Time from Input = 0.5 V to Vout = 1.0 V) | | 7 | | us |
| Single-end Input Control Conditions Vbat = 6 to 28 V; $T_J$ = −40° C. to +150° C. (unless otherwise specified) | | | | | | |
| $V_{INL}$ | Input low voltage | | 1.0 | | 2.0 | V |
| $V_{INH}$ | Input high voltage | | 1.3 | | 2.3 | V |
| $V_{INHys}$ | Input voltage hysteresis | | 0.25 | | | |
| $R_{IN}$ | Input impedance | Vin = 0 to 5 V | 350 | 450 | 550 | Ω |
| $T_{spike}$ | Input spike filter | Delay on rising and falling edge of Input | | 7 | | us |
| Get Output Voltage Max Vbat = 6 to 28 V; $T_J$ = −40° C. to 150° C. (unless otherwise specified) | | | | | | |
| $V_{gmax}$ | Vgate max | 16KΩ pulldown resistor | 4.5 | 5.25 | 6 | V |
| $V_{glow}$ | Vgate low | (0 mA < Igate < 0.4 mA @T = 25° C.) | 0.0 | | 0.2 | V |
| Diagnostic Functions and Protection Vbat = 6 to 28 V; $T_J$ = −40° C. to 150° C. (unless otherwise specified) | | | | | | |
| $CSSD_{MIN}$ | Minimum dwell time capacitor | | 2.3 | | | nF |
| $I_{CSSD}$ | CSSD Pin current for TDMAX | | 0.8 | 1.2 | 1.6 | uA |
| $I_{IN}$ | Input current | | 0.5 | | 15 | mA |
| $T_{D1}$ | Turn on delay time | (Time from Input = 4.0 V to Vout = 4.0 V) | | 7 | | us |
| $T_{D2}$ | Turn off delay time | (Time from Input = 0.5 V to Vout = 1.0 V) | | 7 | | us |
| $V_{OVS}$ | Over voltage shutdown | | | 33 | | V |

The above descriptions are meant to be exemplary only and are not limited to the examples shown in the drawings and described hereinbefore, and those skilled in the art will recognize that changes may be made to the embodiments described without department from the scope of the invention disclosed. Still, other modifications varied in efficient manners within the scope of the present invention, and their technical equivalents will be apparent to those skilled in the art, in light of a review of this disclosure, and such modifications are intended to fall within the appended claims.

The invention claimed is:

1. An ignition drive module, comprising a module signal input end, a voltage input end and a module signal output end, characterized in that it comprises a comparator connected to the module signal input end, a maximum dwell timer module connected to the comparator, a logical judgment module connected to the comparator, and an insulated gate bipolar transistor connected to the logical judgment module which receives the signals from the maximum dwell timer module and the comparator to determine whether to activate the insulated gate bipolar transistor whose output end is connected to the module signal output end.

2. The ignition drive module according to claim 1, wherein, it comprises a pull-down current input end which is respectively connected to the input ends of the comparator along with the module signal input end.

3. The ignition drive module according to claim 2, wherein, a current buffer is provided between the comparator and the pull-down current input end.

4. The ignition drive module according to claim 1, wherein, it comprises a peak filter connected to the output end of the comparator to filter the input positive or negative peak value less than preset time Ts.

5. The ignition drive module according to claim 1, wherein, it comprises a dwell time input end connected to the maximum dwell timer module, the maximum dwell time of which can be modified by setting the dwell time capacitor.

6. The ignition drive module according to claim 5, wherein, the dwell time input end is provided with a dwell time capacitor.

7. The ignition drive module according to claim 5, wherein, a soft-off switch is arranged between the maximum dwell timer module and the dwell time input end, one end of which is connected to the insulated gate bipolar transistor so that the soft-off switch is turned on to turn off the insulated gate bipolar transistor.

8. An ignition drive circuit, characterized in that it comprises the ignition drive module according to claim 7, and a triode connected to the module signal output end, wherein the base of the triode is connected to the module signal output end and the collector of the triode is connected to an ignition coil.

9. The ignition drive circuit according to claim 8, wherein, the emitter of the triode is grounded through a sensing resistor and the ignition drive module is provided with a sensing voltage input end which is connected to the emitter of the triode.

10. The ignition drive circuit of claim 8, wherein, the ignition coil comprises a primary coil and a secondary coil, and one end of the primary coil is connected to the base of the triode, and the other end is connected to the voltage input ends.

* * * * *